(12) United States Patent
Tanaka

(10) Patent No.: US 7,864,535 B2
(45) Date of Patent: Jan. 4, 2011

(54) ELECTRONIC DEVICE

(75) Inventor: Makoto Tanaka, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/192,852

(22) Filed: Aug. 15, 2008

(65) Prior Publication Data

US 2009/0067134 A1    Mar. 12, 2009

(30) Foreign Application Priority Data

Sep. 10, 2007    (JP)    ............................. 2007-234327

(51) Int. Cl.
*H05K 7/20*    (2006.01)
(52) U.S. Cl. ..................... 361/719; 361/687; 361/689; 361/704; 257/712; 257/718
(58) Field of Classification Search ................ None
See application file for complete search history.

(56) References Cited

U.S. PATENT DOCUMENTS

| | | | | |
|---|---|---|---|---|
| 5,497,289 A | * | 3/1996 | Sugishima et al. | .......... 361/709 |
| 5,546,275 A | * | 8/1996 | Moutrie et al. | .............. 361/707 |
| 5,659,459 A | * | 8/1997 | Wakabayashi et al. | ...... 361/753 |
| 5,966,287 A | * | 10/1999 | Lofland et al. | .............. 361/704 |
| 6,088,226 A | * | 7/2000 | Rearick | ....................... 361/704 |
| 6,278,610 B1 | * | 8/2001 | Yasufuku et al. | ............ 361/704 |
| 6,320,748 B1 | * | 11/2001 | Roden et al. | ................. 361/704 |
| 6,370,026 B2 | * | 4/2002 | Sunaga et al. | ................ 361/719 |
| 6,375,476 B1 | * | 4/2002 | Goodwin et al. | .............. 439/71 |
| 6,798,663 B1 | * | 9/2004 | Rubenstein | ................... 361/710 |
| 7,106,595 B2 | * | 9/2006 | Foster et al. | ................. 361/721 |
| 7,230,831 B2 | * | 6/2007 | Luckner et al. | ............. 361/719 |
| 7,450,387 B2 | * | 11/2008 | Cheng et al. | ................. 361/704 |
| 7,457,122 B2 | * | 11/2008 | Lai et al. | ..................... 361/704 |
| 7,567,438 B1 | * | 7/2009 | Barsun et al. | ............... 361/709 |
| 2008/0291639 A1 | * | 11/2008 | Li et al. | ...................... 361/719 |

FOREIGN PATENT DOCUMENTS

| | | |
|---|---|---|
| JP | 7-66573 | 3/1995 |
| JP | 2004-228529 | 8/2004 |
| JP | 2006-133650 | 5/2006 |

* cited by examiner

*Primary Examiner*—Boris L Chervinsky
(74) *Attorney, Agent, or Firm*—Blakely, Sokoloff, Taylor & Zafman LLP

(57) ABSTRACT

According to one embodiment, a heat sink includes an extended end screwed to a printed circuit board. The extended end includes a screw hole and an engagement projection. A notch is formed by cutting the side of the printed circuit board to a position at which the notch does not interfere with signal lines. The notch is engaged with an engagement projection extending from the extended end, thereby preventing the heat sink from rotating when the heat sink is screwed to the printed circuit board.

6 Claims, 6 Drawing Sheets

ELECTRONIC DEVICE

CROSS-REFERENCE TO RELATED APPLICATIONS

This application is based upon and claims the benefit of priority from Japanese Patent Application No. 2007-234327, filed Sep. 10, 2007, the entire contents of which are incorporated herein by reference.

BACKGROUND

1. Field

One embodiment of the present invention relates to an electronic device having a printed circuit board provided with an electronic component that generates heat, and more particularly to an electronic device provided with a rotation preventing structure that operates when a heat sink is attached to the electronic component.

2. Description of the Related Art

In general, a heat sink made relatively large to exhibit a high heat dissipation efficiency is provided on a heat-generating electronic component, such as a CPU, mounted on a printed circuit board in an electronic device. The relatively large heat sink inevitably increases the size of the entire device.

To avoid this, a heat dissipation structure for heat-generating electronic components, which is made compact and thin without changing the size of the heat sink incorporated therein, has been developed by contriving the way of attachment of the heat sink to the printed circuit board (see, for example, Jpn. Pat. Appln. KOKAI Publication No. 2004-228529, paragraph [0006], and FIG. 3).

In the disclosed heat dissipation structure, a relatively large notch is provided at one end of a printed board 4, and a heat sink 2 with a heat-generating electronic component 1 attached thereto is made to cover the notch so that an auxiliary heat sink 5 attached to the lower surface of the heat sink 2 is received in the notch, thereby channeling the heat of the electronic component 1 to the main body 8 of the tool provided on the reverse side of the printed board 4.

When the disclosed heat dissipation structure, in which the heat sink 2 with the heat-generating electronic component 1 attached thereto is made to cover the notch of the printed board 4, and the auxiliary heat sink 5 is provided in the notch, is employed, no structure projects from the outline of the printed board 4 and hence the entire device can be made compact.

However, in the disclosed case, it is necessary to form a relatively large notch at one end of the printed board 4. This reduces the space for mounting other electronic components or for wiring, which is disadvantageous to currently rapidly advanced high-density mounting. Further, in the disclosed structure, a groove 14 to be engaged with a claw 13 projecting from the heat sink 2 is also formed in the inner edge of the notch of the printed board 4 to prevent the member 2 to rotate when the member 2 is screwed to the main body 8. The existence of the groove makes it further difficult to design the printed board, i.e., to realize high-density mounting.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings.

In general, according to one embodiment of the invention, there is provided an electronic device incorporating a printed circuit board which is contained in a casing and provided with a heat-generating electronic component. The printed circuit board comprises a signal layer including a signal line which extends along a side of the printed circuit board; a ground layer having conductive foil grounded and superposed on the signal line via an insulating layer; a screw hole for screwing, to the printed circuit board, a heat dissipation member in a state in which the heat dissipation member is kept in contact with the electronic component; and a notch formed by cutting the side to a position at which the notch does not interfere with the signal line, and configured to receive an engagement projection extending from the heat dissipation member, to prevent the heat dissipation member from rotating when the heat dissipation member is screwed to the printed circuit board.

Figure 1:
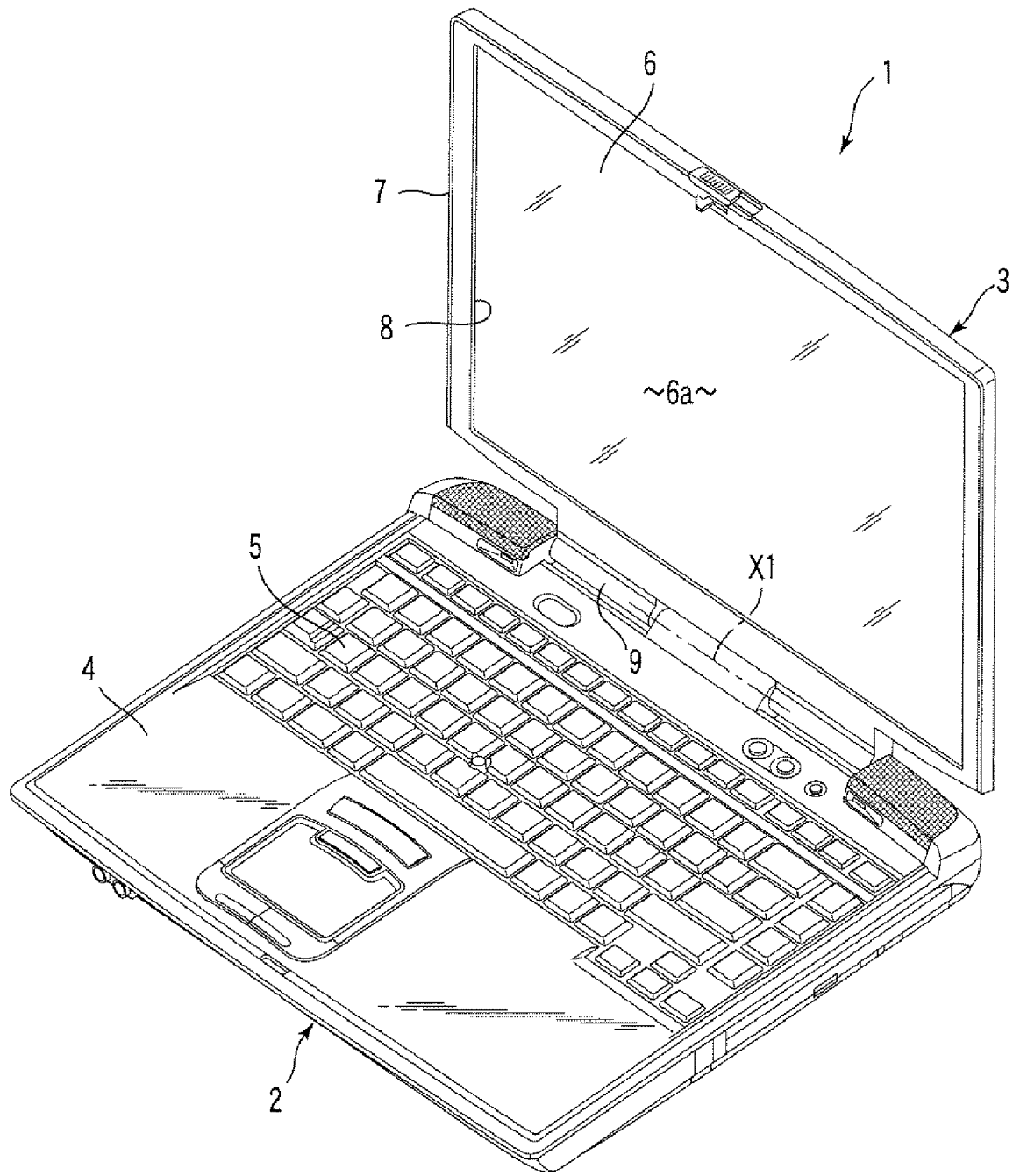
FIG. 1 is a perspective view illustrating the appearance of a portable computer as an example of an electronic device according to the invention.
Figure 2:
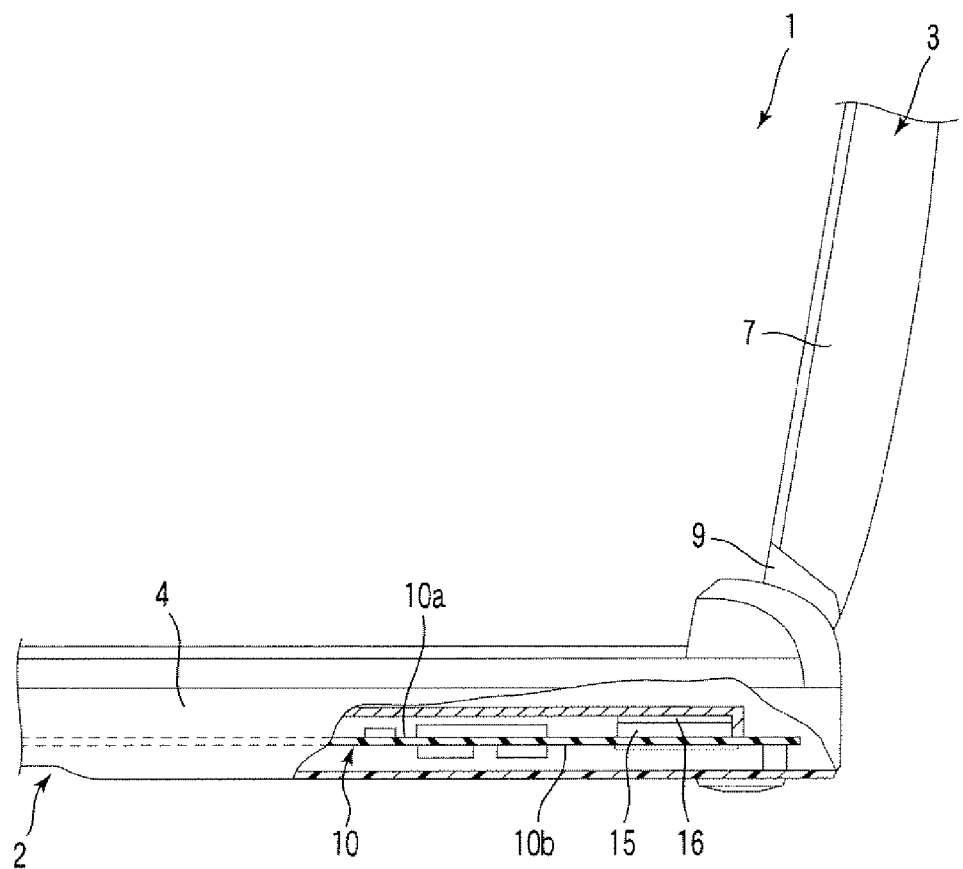
FIG. 2 is a side view partly in section, illustrating the essential part of the portable computer shown in FIG. 1.

FIG. 1 is a perspective view illustrating the appearance of a portable computer 1 (hereinafter referred to simply as a "PC 1") as an example of the electronic device according to the invention. FIG. 2 is a side view partly in section, illustrating the essential part of the PC 1 shown in FIG. 1.

As shown in FIGS. 1 and 2, the PC 1 comprises a main unit 2 and display unit 3. The main unit 2 has a flat, rectangular first casing 4, and a keyboard 5 provided on the upper surface of the first casing 4.

The display unit 3 comprises a liquid crystal display panel 6, and a second casing 7 that receives the panel 6. The liquid crystal display panel 6 has a screen 6a for displaying images. The second casing 7 is also flat and rectangular, and has a rectangular opening 8 in its front surface. The screen 6a of the liquid crystal display panel 6 is exposed to the outside through the opening 8.

The second casing 7 has leg portions 9 rotatably coupled to the rear end of the first casing 4 via hinges (not shown). The hinges have a horizontal axis X1 extending lengthwise. Thus, the display unit 3 is rotatable about the axis X1 between the open position and the closed position.

In the closed position, the display unit 3 lies on the main unit 2 and covers the keyboard 5 from above. In the open position, the display unit 3 stands on the main unit 2, and the keyboard 5, screen 6a, etc., are exposed to the outside. FIGS. 1 and 2 show the state in which the display unit 3 is in the open position.

Further, as shown in FIG. 2, a printed circuit board 10 is incorporated in the first casing 4 of the main unit 2. The printed circuit board 10 includes a first surface 10a opposing the reverse side of the keyboard 5, and a second surface 10b opposing the bottom of the first casing 4.

Figure 3:
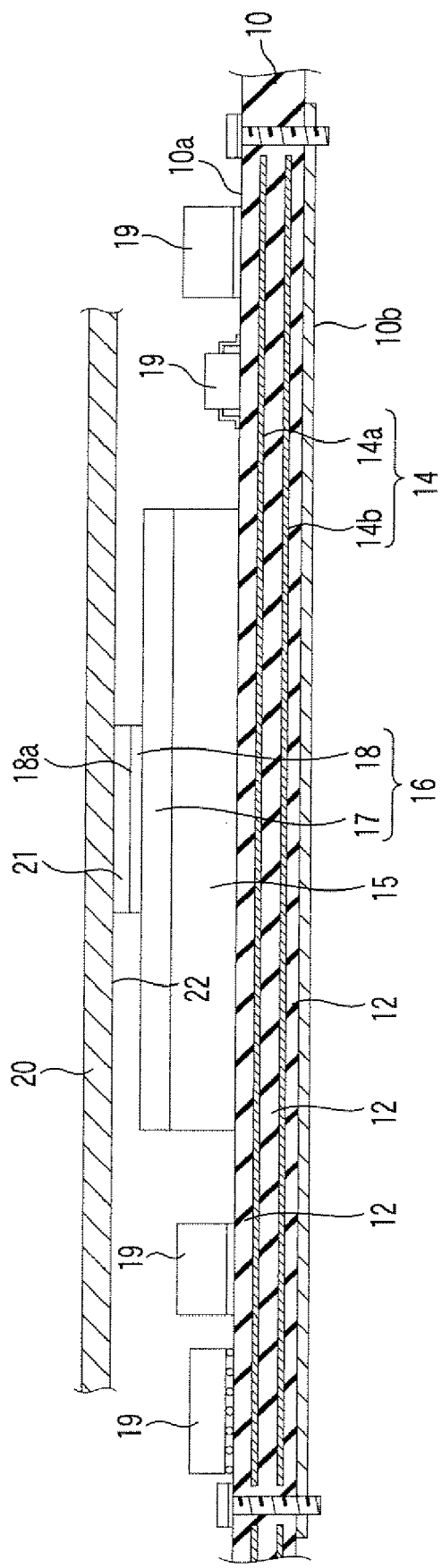
FIG. 3 is an enlarged sectional view illustrating the essential part of a printed circuit board incorporated in the personal computer of FIG. 1.

FIG. 3 is an enlarged sectional view illustrating the printed circuit board 10 and its peripheral structure. As shown, the printed circuit board 10 has a multi-layer structure in which a plurality of insulating layers 12 and conductive layers 14 are alternately stacked on each other between the first and second surfaces 10a and 10b. At least a signal layer 14a and ground layer 14b are included as the conductive layers 14. The signal layer 14a contains a plurality of signal lines for transmitting data at a relatively high speed, as will be described later. A power supply layer (not shown) is also included as the conductive layers 14. Thus, the printed circuit board 10 generally includes 6 to 8 layers, and as many as 10 layers depending upon circumstances.

The signal layer 14a and power supply layer are formed in the form of lines in accordance with a preset pattern, and the ground layer 14b covers substantially the entire portion in the printed circuit board 10. More specifically, the ground layer 14b is formed of conductive foil (described later), such as copper foil, and is superposed on a plurality of signal lines incorporated in the signal layer 14a. The ground layer 14b of conductive foil enables the signal lines to stably perform high-speed transmission of data For instance, the signal lines 14a are, for example, a printer-port signal line, a serial-port signal line and a control-bus signal line connecting a CPU and south bridge, which are used to transmit data at relatively high speed.

A CPU socket 15 is soldered to the first surface 10a of the printed circuit board 10. The CPU socket 15 supports a CPU 16 as a heat-generating electronic component so that the CPU can be detached. The CPU 16 includes a base substrate 17 having a plurality of pin terminals, and an IC chip 18 mounted on the central portion of the base substrate 17. The IC chip 18 of high processing speed and multi-functionality generates a great amount of heat during operation, and hence must be cooled to maintain its stable operation.

In addition to the CPU 16, a plurality of circuit components 19, such as transistors, capacitors, coil and resistors, are mounted on the first surface 10a of the printed circuit board 10. The circuit components 19 cooperate with the printed circuit board 10 to constitute a power supply circuit for supplying power to the CPU 16. The circuit components 19 are located around the CPU 16 on the first surface 10a of the printed circuit board 10. Since the heat amount of the circuit components 19 reaches an unignorable value in accordance with an increase in the power consumption of the CPU 16, they must also be cooled to maintain their stable operations. Namely, the circuit components 19 are also heat-generating electronic components.

A description will now be given of a heat dissipation structure employed for the CPU 16 included in the heat-generating electronic components 16 and 19.

As shown in FIG. 3, a plate-like heat sink 20 (heat dissipation member) is provided on the upper surface 18a of the IC chip 18 of the CPU 16 away from the base substrate 17, via a heat conductive material 21, such as grease excellent in heat conductivity. Namely, the surface of the heat sink 20 facing the CPU 16 functions as a heat receiving surface 22 for receiving the heat of the CPU 16 via the heat conductive material 21, and the surface of the heat sink 20 not facing the CPU 16 functions as a heat dissipating surface for dissipating the received heat. Thus, the CPU 16 is cooled.

The heat sink 20 is a plate greater than the CPU 16. Several peripheral portions (not shown) of the heat sink 20 are extended to the first surface 10a of the printed circuit board 10, and extended ends 30 (see FIGS. 4A and 4B) of the heat sink 20 are screwed thereto. When the plate-like heat sink 20 is screwed to the printed circuit board 10, the force of rotation due to the screwing operation is exerted around the screw holes of the heat sink 20, whereby the heat sink 20 is rotated by the screwing operation. To enhance the efficiency of the screwing operation, it is necessary to temporarily secure the heat sink 20 to the printed circuit board 20 so as not to rotate the heat sink 20.

Figure 4A:
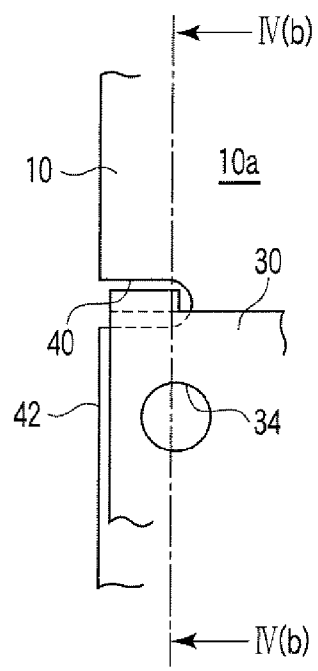
FIG. 4A is a plan view illustrating a rotation preventing structure according to a first embodiment and incorporated in an attachment portion for attaching a heat sink to the printed circuit board of FIG. 3.
Figure 4B:
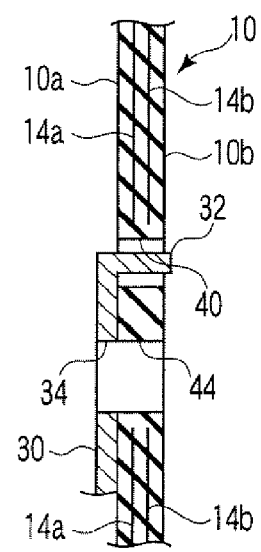
FIG. 4B is a sectional view taken along line IV(b)-IV(b) of FIG. 4A.

FIG. 4A is an enlarged plan view illustrating an attachment portion for attaching the heat sink 20 to the printed circuit board 10. FIG. 4B is a sectional view taken along line IV(b)-IV(b) of FIG. 4A. The rotation preventing structure of the heat sink 20 according to a first embodiment of the invention will now be described.

As the rotation preventing structure, each extended end 30 of the heat sink 20 includes an engagement projection 32 extending therefrom and fitted in the corresponding notch 40 formed in the printed circuit board 10. Namely, each engagement projection 32 is formed by bending part of the corresponding substantially rectangular extended end 30 through substantially 90 degrees with respect to the printed circuit board 10. The notch 40 formed in the printed circuit board 10 to receive the engagement projection 32 is formed by cutting out part of a side 42 of the board 10.

Each extended end 30 has a screw hole 34 for inserting a screw (not shown) therethrough. The printed circuit board 10 has screw holes 44 substantially identical to and arranged coaxial with the respective screw holes 34 of the extended ends 30. Screws (not shown) are screwed into the respective pairs of coaxial screw holes 34 and 44, thereby screwing the extended ends 30 to the printed circuit board 10. At this time, each engagement projection 32 is received in the corresponding notch 40 to prevent the rotation of the heat sink 20. Each engagement projection 32 and notch 40 also function to prevent rotation of the heat sink 20 when any other extended end (not shown) of the heat sink 20 is screwed to the printed circuit board 10.

Figure 5:
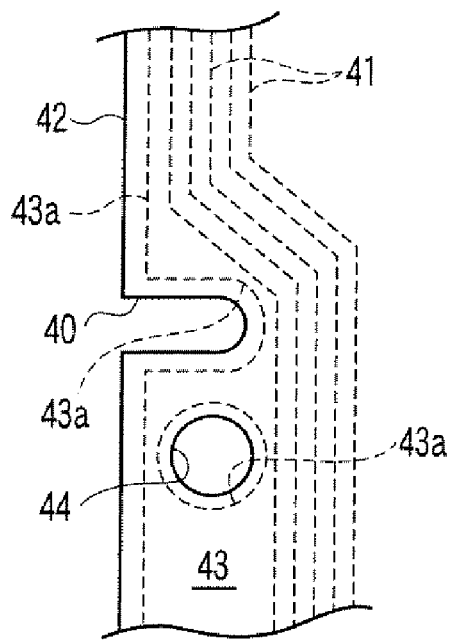
FIG. 5 is a schematic enlarged view illustrating part of the printed circuit board shown in FIGS. 4A and 4B, in which signal lines and the edge of conductive foil are indicated by the broken lines.

In FIG. 5, the signal lines 41 of the above-mentioned signal layer 14a, and the edges 43a of the above-mentioned conductive foil 43 of the ground layer 14b are indicated by the broken lines. As shown, the signal lines 41 extend along one side 42 of the printed circuit board 10. Further, each notch 40 formed by cutting out part of the side 42 of the printed circuit board 10 extends to a position at which it does not interfere with the signal lines 41. Each screw hole 44 is formed in the printed circuit board 10 between the side 42 and signal lines 41 at a position at which it does not interfere with the signal lines 41.

Furthermore, the edges 43a of the conductive foil 43 are located with preset allowances interposed between them and the side 42 of the board 10, the edge of each notch 40 and the edge of each screw hole 44. Namely, supposing that the conductive foil 43 is superposed upon the signal lines 41 as described above, it is necessary to separate the signal lines 41 from the edge of each notch 40 at least by a distance corresponding to the above-mentioned allowance related to the edges 43a of the conductive foil 43. Similarly, the edge of each screw hole 44 needs to be separate from the signal lines 41 at least by a distance corresponding to the above-mentioned allowance. The "position at which no interference occurs" recited in the claims means the position separate by the distance corresponding to the allowance.

In the first embodiment, each notch 40 is formed as a slim slot extending substantially perpendicular to the side 42 of the printed circuit board, and each engagement projection 32 is formed as a plate-like member of a cross section extending along the corresponding notch 40. Namely, in the embodiment, the engagement projections 32 and notches 40 are extended substantially perpendicular to the side 42 of the printed circuit board 10, so that the engagement projections 32 are prevented from moving along the side 42 when the heat sink 20 is screwed to the board 10.

Figure 6:
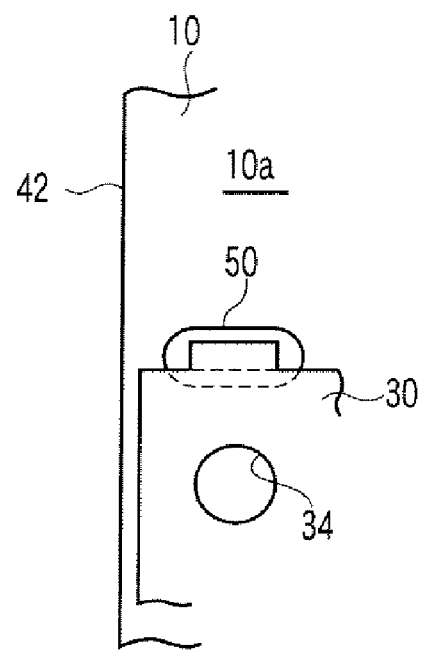
FIG. 6 is a plan view illustrating prior art in which a long hole is formed, instead of a notch, in the printed circuit board shown in FIGS. 4A and 4B.
Figure 7:
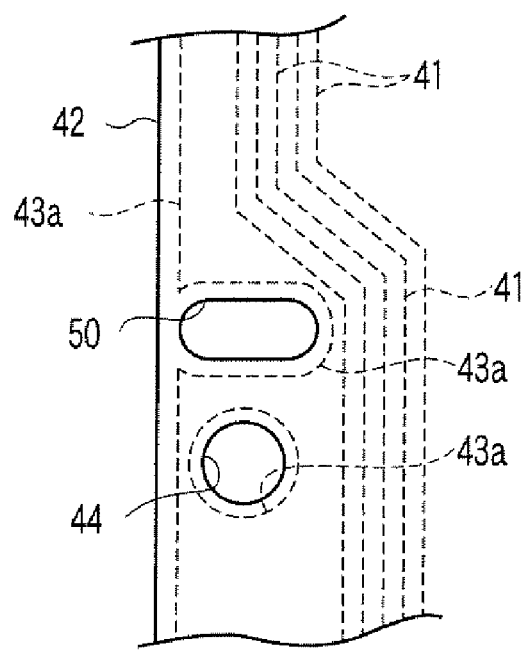
FIG. 7 is a schematic enlarged view illustrating part of the printed circuit board shown in FIG. 6, in which signal lines and the edge of conductive foil are indicated by the broken lines.

FIG. 6 shows a conventional structure as a comparative example, in which a long hole 50 is formed near the side 42 of the printed circuit board 10, instead of the above-mentioned notch 40. In FIG. 7, the broken lines indicate the layout of the signal lines 41 and the edges 43a of the conductive foil 43.

Thus, when the closed long hole 50 is formed in the portion of the printed circuit board 10 away from the side 42 thereof, the signal lines 41 are located by a longer distance from the side 42 of the board 10 than in the above embodiment in which the notch 40 is formed. This reduces the degree of freedom in designing the printed circuit board 10.

More specifically, it is desirable to minimize the width of the engagement projection 32 received by the notch 40 or long hole 50 in view of designing. However, the allowable minimum width of the engagement projection 32 is substantially determined from various conditions, such as the thickness, material and machining accuracy of the heat sink 20. Therefore, in the comparative example in which the long hole 50 is formed in the portion of the printed circuit board 10 away from the side 42 thereof, the degree of freedom in designing the board 10 is inevitably reduced.

In contrast, in the above-described embodiment, since the side 42 of the printed circuit board 10 is cut to a position at which the signal lines 41 are not interfered, to thereby form each notch 40 of a desired depth, the signal lines 41 can be provided closer to the side 42 of the printed circuit board 10 than in the conventional case, thereby increasing the degree of freedom in designing. Namely, when the rotation preventing structure of the invention is employed, not only the workability of attaching the heat sink 20 can be enhanced, but also the area for wiring, such as the signal lines, and for mounting other electronic components can be increased.

Further, in the first embodiment, the printed circuit board 10 can be processed easily, and hence the manufacturing cost of the electronic apparatus can be reduced. In other words, when the side 42 of the printed circuit board 10 is cut to form the notch 40 therein, this can be realized without exchanging, for another one, the tip element of the drill for cutting the side 42. Thus, no process of exchanging drill tip elements is necessary, which reduces the number of process steps and therefore the process time, resulting in reduction of manufacturing cost.

In the embodiment, the distance between the signal lines 41 and the side 42 of the printed circuit board 10 is substantially determined from the width of the engagement projection 32, i.e., the depth of the notch 40. At this time, it is desirable that the screw hole 44 of the printed circuit board 10 be formed so that the distance between the innermost edge portion of the screw hole and the outermost signal line 41 is longer than that between the innermost edge portion of the notch 40 and the outermost signal line 41. It is also desirable that the distance between the notch 40 and screw hole 44 along the side 42 be minimized in view of designing the signal lines 41. In this case, however, it is desirable that the distance between the notch 40 and screw hole 44 be set to a minimum value that is determined in consideration of the mechanical strength of the board 10 therebetween, the diameter of the tip of a screw (not shown) inserted in the screw hole, etc.

A description will be given of a rotation preventing structure according to a second embodiment. In the second embodiment, the elements similar to those of the first embodiment are denoted by the corresponding reference numbers, and will not be described in detail.

Figure 8A:
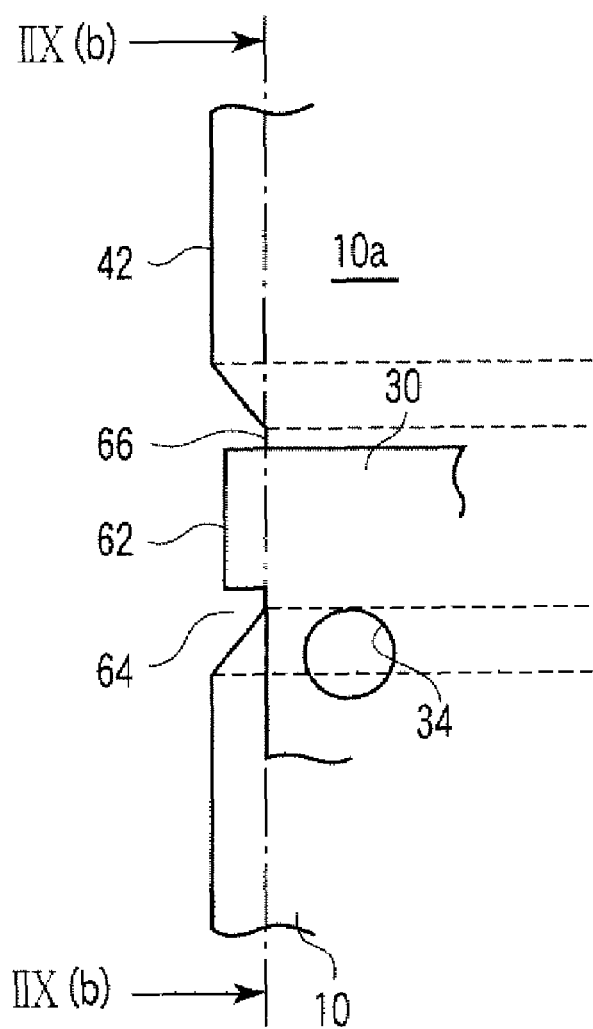
FIG. 8A is a plan view illustrating a rotation preventing structure according to a second embodiment.
Figure 8B:
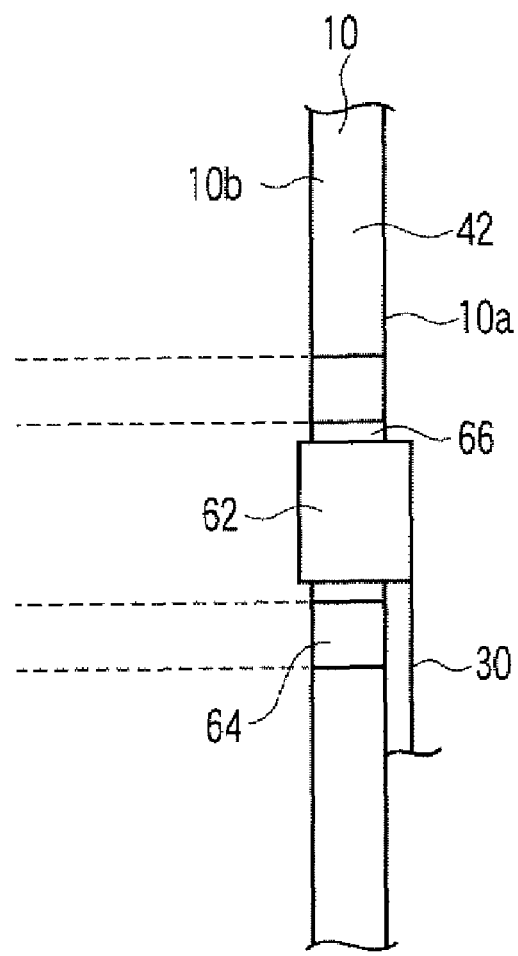
FIG. 8B is a sectional view taken along line IIX(b)-IIX(b) of FIG. 8A.

FIG. 8A is a plan view illustrating the rotation preventing structure of the second embodiment. FIG. 8B is a sectional view taken along line IIX(b)-IIX(b) of FIG. 8A.

The second embodiment employs an engagement projection 62 that is formed integral with the extended end 30 of the heat sink 20, projecting therefrom to the printed circuit board 10, and is arranged substantially perpendicular to the engagement projection 32 of the first embodiment. The second embodiment also employs a notch 64 that is formed by cutting the side 42 of the printed circuit board 10 to a position at which the resultant notch does not interfere with the signal lines 41, and that has a different shape from the notch 40. Namely, the notch 64 of the second embodiment has an engagement edge 66 extending substantially parallel to the side 42 of the printed circuit board 10, and engaged with the engagement projection 62.

In the rotation preventing structure of the second embodiment, when the heat sink 20 is screwed to the printed circuit board 10, the inner surface of the engagement projection 62 is engaged with the engagement edge 66 of the notch 64 to prevent the engagement projection 62 from moving in the direction substantially perpendicular to the side 42, thereby preventing the heat sink 20 from rotating. In the second embodiment, when the screw (not shown) inserted in the screw hole 34 is rotated clockwise in FIGS. 8A and 8B, the inner surface of the engagement projection 62 is engaged with the engagement edge 66.

Figure 9A:
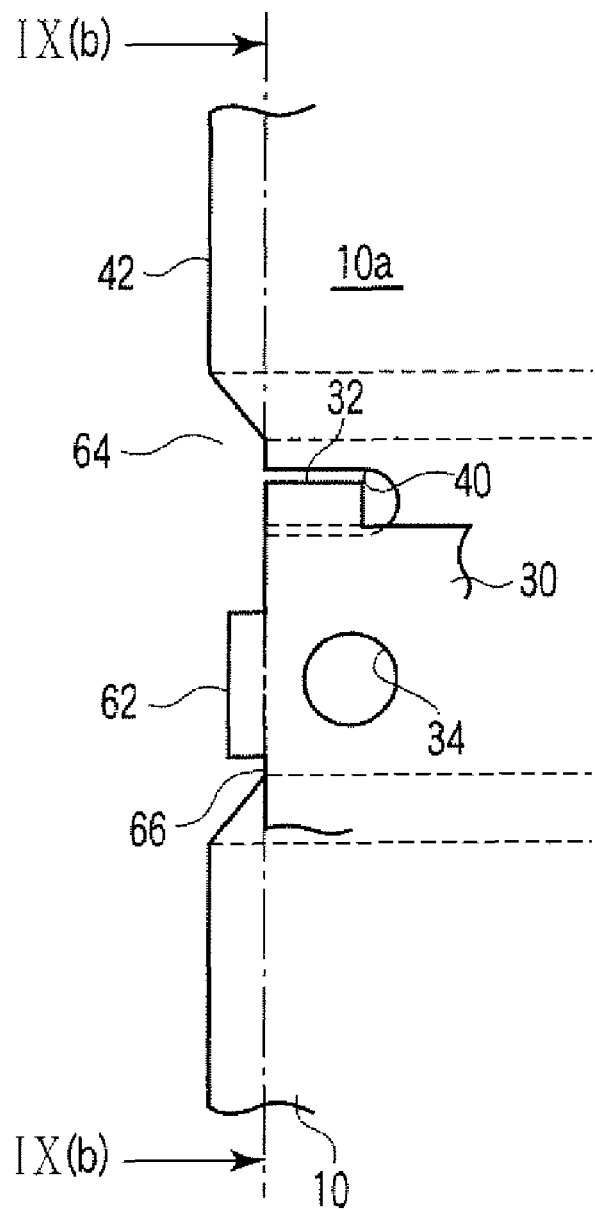
FIG. 9A is a plan view illustrating a rotation preventing structure according to a third embodiment.
Figure 9B:
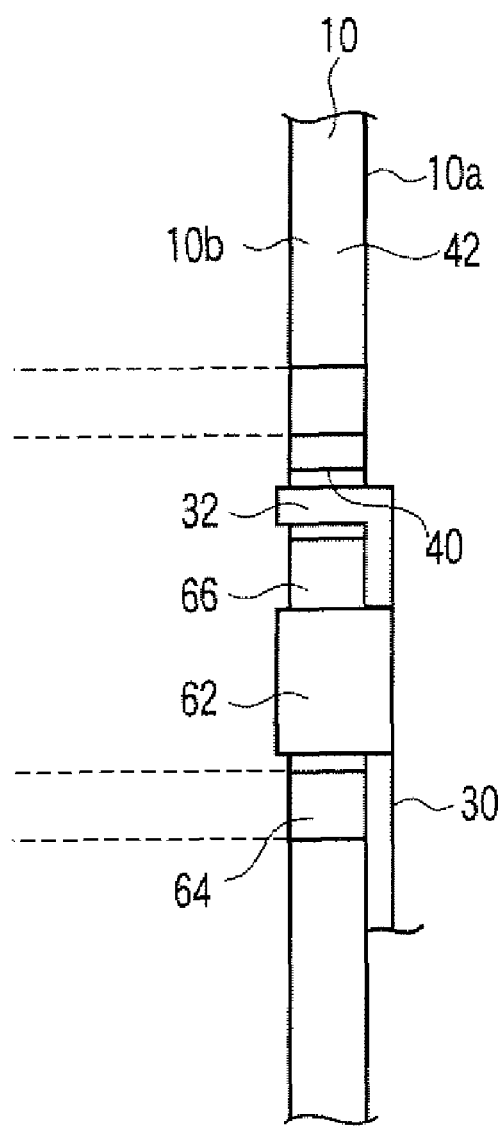
FIG. 9B is a sectional view taken along line IX(b)-IX(b) of FIG. 9A.

FIG. 9A is a plan view illustrating a rotation preventing structure according to a third embodiment, and FIG. 9B is a sectional view taken along line IX(b)-IX(b) of FIG. 9A.

The rotation preventing structure of the third embodiment has both of the above-described structures of the first and second embodiments. Specifically, this embodiment employs two engagement projections 32 and 62 projecting from each extended end 30 of the heat sink 20, and a notch 64 formed by cutting out part of the side 42 of the printed circuit board 10, and another notch (second notch) 40 extending from and substantially perpendicular to the engagement edge 66 of the notch 64. The notch 40 extends to a position at which it does not interfere with the signal lines 41.

In this structure, the engagement projection 62 extending substantially parallel to the side 42 of the printed circuit board 10 is engaged with the engagement edge 66 of the notch 64, and the engagement projection 32 (second engagement projection) is engaged with the notch 40, thereby preventing the heat sink 20 from rotating relative to the printed circuit board 10.

In the rotation preventing structure of the third embodiment, when the heat sink 20 is screwed to the printed circuit board 10, the inner surface of the engagement projection 62 is engaged with the engagement edge 66 of the notch 64 to prevent the engagement projection 62 from moving in the direction substantially perpendicular to the side 42. Further, the engagement projection 32 is engaged with the notch 40 to prevent the projection 32 from moving along the side 42. As a result, the rotation of the heat sink 20 is prevented.

As described above, also in the second and third embodiments, without reducing the degree of freedom in designing the printed circuit board 10, the rotation preventing structure for the heat sink 20 can be realized, the workability of attaching the heat sink 20 be enhanced, and the mounting space of the board 10 be enlarged.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For instance, the shapes of the notches 40 and 64 are not limited to the above-described ones, but may be arbitrarily modified in accordance with the shapes of the respective engagement projections.

What is claimed is:

1. An electronic device incorporating a printed circuit board which is contained in a casing and provided with a heat-generating electronic component,
the printed circuit board comprising:
a signal layer including a signal line which extends along a side of the printed circuit board;
a ground layer having conductive foil grounded and superposed on the signal line via an insulating layer;
a screw hole for screwing, to the printed circuit board, a heat dissipation member in a state in which the heat dissipation member is kept in contact with the electronic component; and
a notch formed by cutting the side to a position at which the notch does not interfere with the signal line, and configured to receive an engagement projection extending from the heat dissipation member, to prevent the heat dissipation member from rotating when the heat dissipation member is screwed to the printed circuit board.

2. The electronic device of claim 1, wherein the screw hole includes a screw hole formed in the printed circuit board between the side and the signal line at a position at which the screw hole does not interfere with the signal line.

3. The electronic device of claim 2, wherein the conductive foil is provided at a certain distance to an edge of the notch, and at a certain distance to an edge of the screw hole formed adjacent to the notch.

4. The electronic device of claim 1, wherein the notch is formed in a slim slit extending substantially perpendicular to the side, and receives the engagement projection extending from the heat dissipation member and formed like a plate, to prevent the engagement projection from moving along the side.

5. The electronic device of claim 1, wherein the notch includes an engagement edge extending substantially parallel to the side and engaged with the engagement projection to prevent the engagement projection from moving substantially perpendicularly along the side.

6. The electronic device of claim 5, further comprising a second notch formed in a slim slit and extending substantially perpendicular to the engagement edge, the second notch receiving a second engagement projection, different from the engagement projection, extending from the heat dissipation member to prevent the second engagement projection from moving along the side.

* * * * *